United States Patent [19]

Miller et al.

[11] Patent Number: 4,914,081

[45] Date of Patent: Apr. 3, 1990

[54] PROCESS FOR MAKING METALLIZED STRUCTURE AND ARTICLE COMPRISING STRUCTURE

[75] Inventors: Barry Miller, New Providence; Joseph M. Rosamilia, Berkeley Heights, both of N.J.

[73] Assignee: American Telephone and Telegraph Company, AT&T Bell Laboratories, Murray Hill, N.J.

[21] Appl. No.: 144,832

[22] Filed: Jan. 15, 1988

[51] Int. Cl.$^4$ ................................................. C25D 7/00
[52] U.S. Cl. ............................................ 505/1; 204/15; 204/23; 204/27; 204/42; 204/46.1; 505/810; 505/813; 505/818; 505/821
[58] Field of Search ............... 505/813, 818, 821, 810, 505/1; 204/58.5, 46.1, 15, 27, 28, 23, 42

[56] References Cited

U.S. PATENT DOCUMENTS

| | | | |
|---|---|---|---|
| 1,947,981 | 2/1934 | Fischer | 204/42 |
| 2,430,468 | 11/1947 | Julich et al. | 204/42 |
| 2,798,037 | 7/1957 | Robinson | 204/42 |
| 3,595,693 | 7/1971 | Cecil et al. | 427/62 |
| 4,762,754 | 8/1988 | Nellis et al. | 428/552 |

FOREIGN PATENT DOCUMENTS

22622 of 1899 United Kingdom ............... 204/58.5

OTHER PUBLICATIONS

L. F. Yntema et al., J. Am. Chem. Soc., vol. 52, pp. 2693–2698, (Jul. 1930).
R. D. Blue et al., pp. 231–238, (1933).
A. J. Dill, Plating, pp. 1048–1052, (Nov. 1972).
A. F. Ibragimova et al., Industrial Lab., vol. 41, No. 1, pp. 64–65, (Jan. 1975).
Z. Phys. B.-Condensed Matter, Springer-Verlag, 1986, "Possible High $T_c$ Superconductivity in the Ba–La–Cu–O System", by J. G. Bednorz and K. A. Muller, pp. 189–193.
Journal of the Electrochemical Society, Accelerated Brief Communications, Jul. 1987, "Aqueous Electrochemistry of Cuprate-Based High $T_c$ Superconductors" by J. M. Rosamilia, B. Miller, L. F. Schneemeyer, J. V. Waszczak and H. M. O'Bryan, Jr., pp. 1863–1864.
Physical Review Letters, vol. 58, No. 9, Mar. 1987, "Superconductivity at 93 K in a New Mixed-Phase Y–Ba–Cu–O Compound System at Ambient Pressure", by P. H. Hor, R. L. Meng, L. Gao, Z. J. Huang, Y. Q. Wang & C. W. Chu, pp. 908–910, (Also by M. K. Wu, J. R. Ashburn and C. J. Torng).
Physical Review Letters, vol. 58, No. 16, Apr. 20, 1987, "Bulk Superconductivity at 91 K in Single-Phase Oxygen-Deficient Perovskite $Ba_2YCu_3O_9-\delta$", by R. J. Cava, B. Batlogg, R. B. vanDover, D. W. Murphy, S. Sunshine, T. Siegrist, J. P. Remeika, E. A. Rietman, S. Zahurak, and G. P. Espinosa, pp. 1676–1679.
Physical Review Letters, vol. 58, No. 9, Mar. 2, 1987, "High-Pressure Study of the New Y–Ba–Cu–O Superconducting Compound System", by P. H. Hor, L. Gao, R. L. Meng, Z. J. Huang, Y. Q. Wang, K. Forster, J. Vassilious, and C. W. Chu, M. K. Wu, J. R. Ashburn, and C. J. Torng, pp. 911–912.
Superconductor Applications: SQUIDS and Machines, edited by Brian B. Schwartz and Simon Foner, Plenum Press, New York and London, 1977.
Superconductor Materials Science: Metallurgy, Fabrication, and Applications edited by Simon Foner and Brian B. Schwartz, Plenum Press, New York and London, 1981.
Advanced Ceramic Materials, vol. 2, No. 3B, Special Issue, 1987, "Fabrication of Ceramic Articles from High $T_c$ Superconducting Oxides", by D. W. Johnson, Jr., E. M. Gyorgy, W. W. Rhodes, R. J. Cava, L. C. Feldman and R. B. van Dover, pp. 364–371.

(List continued on next page.)

Primary Examiner—G. L. Kaplan
Attorney, Agent, or Firm—Walter G. Nilsen

[57] ABSTRACT

Processes are described for electroplating metal or alloy on superconducting oxides using either a nonaqueous bath or aqueous bath with suitably applied potential. Articles made in accordance with the electroplating process are also described.

39 Claims, 1 Drawing Sheet

OTHER PUBLICATIONS

*Appl. Phys. Lett.*, 51 (12), Sep. 21, 1987, "Fabrication of dense Ba$_2$YCU$_3$ O$_7\delta$ Superconductor wire by molten oxide processing", by S. Jin, T. H. Tiefel. R. C. Sherwood, G. W. Kammiott and S. M. Zahurak, pp. 943–945.

*Electrochemical Reactions in Nonaqueous Systems*, Charles K. Mann and Karen K. Barnes, Marcel Dekker, Inc. New York, 1970.

Surface Technology, 13 (1981), "Electrodeposition from Organic Solutions of Metals that are difficult to deposit from Aqueous Solutions" by Shoba Jayakrishnan, Malathy Pushpavanam and B. A. Shenoi, pp. 225–240.

*Physical Review Letters*, vol. 58, No. 18, May 4, 1987, "New Superconducting Cuprate Perovskites" by D. W. Murphy, S. Sunshine, R. B. van Dover, R. J. Cava, B. Batlogg, S. M. Zahurak, and L. F. Schneemeyer, pp. 1888–1890.

PROCESS FOR MAKING METALLIZED STRUCTURE AND ARTICLE COMPRISING STRUCTURE

FIELD OF THE INVENTION

The invention involves a process for producing a particular ceramic-metal structure by electrodeposition of metals and to articles with such a ceramic-metal structure. Of particular importance are ceramic-metal structures involving superconducting material.

BACKGROUND OF THE INVENTION

Superconductivity was discovered early in this century in connection with the investigation of electrical properties of materials at low temperatures. Initially, the phenomena of superconductivity was of considerable scientific interest but of limited commercial interest because of the very low temperatures required for initiation of superconductivity. Because of the potential commercial value of high temperature superconductors, much effort was devoted toward finding a high temperature superconductor. Despite these efforts, all superconductor materials known prior to 1986 required liquid helium cooling. For this reason, commercial applications were limited, for the most part to high field electromagnets.

Recently, superconductivity was discovered in a new class of materials, namely, metal oxides. See, for instance, J. G. Bednorz and K. A. Müller, *Zeitschr. f. Physik B—Condensed Matter*, Vol. 64, 189 (1986), which reports superconductivity in lanthanum barium copper oxide. An excellent description of the recent development of metal oxide superconductors is given in a recently filed application entitled Method of making a body, and articles comprising the body, with inventors Ho Sou Chen, George Sanford Indig and Lionel Cooper Kimerling filed in the U.S. Patent and Trademark Office on or about Jan. 11, 1988 with Ser. No. 142,752. This entire application is incorporated herein by reference. Also of interest is the reference entitled "Aqueous Electrochemistry of Cuprate-Based High $T_c$ Superconductors" by J. M. Rosamilia et al *Journal of the Electrochemical Society* 134, #7 (July 1987) and a recently filed application titled "Devices and Systems Based on Novel Superconducting Material," with inventors Bertram Josef Batlogg, Robert Joseph Cara and Robert Bruce van Dover, Ser. No. 024,046 filed Mar. 10, 1987. Both the Rosamilia et al reference and the above application are incorporated herein by reference.

The above report stimulated worldwide research activity, which very quickly resulted in further significant progress. The progress has resulted, inter alia, to date in the discovery that compositions in the Y—Ba—Cu—O system can have superconductive transition temperatures $T_c$ above 77 K., the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of composition and processing techniques that result in the formation of bulk samples of material that can be substantially single phase material and can have $T_c$ above 90 K. (see, for instance, R. J. Cava et al, *Physical Review Letters*, Vol. 58 (16), pp. 1676–1679), incorporated herein by reference.

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be one of the most advantageous cryogenic refrigerants, and attainment of superconductivity at or above liquid nitrogen temperature was a long-sought goal which until very recently appeared almost unreachable.

For a general overview of some potential applications of superconductors see, for instance, B. B. Schwartz and S. Foner, editors, *Superconductor Applications: SQUIDS and Machines*, and S. Foner and B. B. Schwartz, editors, *Superconductor Material Science, Metalurgy, Fabrications, and Applications*, Plenum Press 1981. These references are incorporated herein by reference. Among the applications are power transmission lines, rotating machinery, and superconducting magnets for, e.g., fushion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

Two general approaches for forming superconductive oxide bodies are known to the art. Thin films are formed by deposition of material on a substrate (e.g., by sputtering, evaporation, or decomposition of a solution), followed by a heat treatment that produces the appropriate crystal structure and composition (typically by adjustment of the oxygen content). On the other hand, bulk bodies and thick films are generally produced by synthesizing a powder of the appropriate composition (e.g., $YBa_2Cu_3O_x$, $x \sim 7$), forming the powder into the desired shape (e.g., by hot pressing, drawing, extrusion, or silk screening of a slurry), and heat treating the resulting body such that sintering occurs, and such that the sintered material has the appropriate crystal structure and composition. A further method which comprises melting of the oxide powder and forming bulk bodies by solidification of the oxide melt is discussed below.

The critical temperature $T_c$, i.e., the temperature at which a given body becomes superconductive, is an important parameter of a superconductor. Another important parameter is the maximum current density that can be supported by a body in the superconductive state. This "critical current density" $J_c$ decreases with both increasing temperature and increasing magnetic field.

Work to date has shown that at least some thin films of high $T_c$ superconductors (e.g., $YBa_2Cu_3O_7$) can have high $J_c$ (of order $10^6$ A/cm$^2$ at 77 K.), with $J_c$ being relatively weakly dependent on magnetic field. Work has also shown that, even though individual particles (crystallites) of superconductive oxides (e.g., $YBa_2Cu_3O_7$) can have large internal critical current density $J_c$ (of order $10^6$ A/cm$^2$), the critical current density of bulk bodies produced by sintering of the particles is relatively small, exemplarily of order $10^3$ A/cm$^2$ in zero magnetic field (H=0), and strongly dependent on magnetic field. This huge difference between the $J_c$ of a single particle and of an assembly of particles is generally attributed to the presence of weak links between adjacent particles (by "weak links" we mean herein any inhomogeneity, frequently associated with the surface of a particle or with the contact between two particles, that limits the density of supercurrent that can flow). A critical density of the order of $10^3$ A/cm$^2$ at H=0 is generally thought to be too small for most technologically important applications. Furthermore, the $J_c$ of sintered bulk superconductive oxide bodies decreases rapidly as a function of magnetic field, further limiting the current that could be carried by such prior art bodies.

As discussed above, most bulk high $T_c$ superconductive bodies are produced by ceramic processing techniques that involve sintering of powder material at temperatures below the melting temperature of the material. See, for instance, D. W. Johnson et al, *Advanced Ceramic Material*, Vol. 2 (3B), July 1987, pp. 364–371. However, recently work was reported that represents a significant departure from the conventional (i.e., ceramic) processing method since it involves melting of the metal oxide powder. See S. Jin et al, *Applied Physics Letters*, Vol. 51 (12), pp. 943–945, (1987) and U.S. patent application Ser. No. 126,083, filed Nov. 27, 1987, which is a continuation-in-part of U.S. patent application Ser. No. 062,529, filed June 12, 1987, now abandoned. The "metallurgical" processing technique of Jin et al can result in essentially 100% dense, essentially single phase material in which the grains typically are of relatively large size and typically are non-randomly oriented. Bulk bodies produced by this technique can have substantially larger $J_c$ than has been reported for sintered bodies of the same composition, and, significantly, $J_c$ can decrease more slowly with increasing magnetic field than has been reported for sintered bodies. These improvements are thought to be due at least in part to improved intergranular contact and/or to the presence of orientational correlation between neighboring crystallites. However, even though the melting technique of Jin et al results in substantially improved $J_c$, the observed behavior still suggests that $J_c$ is limited at least to some extent by weak links, possibly associated with compositional inhomogeneity.

In commercial application of these superconductivity materials, two things are desirable. First, the superconducting materials should be protected from the atmosphere to insure stability and prevent reaction between superconducting material and substances in the atmosphere (e.g., water). Second, in many applications where, e.g., high currents and/or high magnetic fields are being used, it is desirable to have an electrical conducting (and perhaps heat conducting) material (generally metal or alloy) in contact with the superconducting material to dissipate heat and provide a parallel conducting path for electrical current when the superconducting material turns non-superconducting so as to avoid damage to the superconducting material.

In view of the enormous economic potential for high temperature superconductivity devices, a reliable procedure for metallizing high temperature superconductor materials is highly desirable. It is also desirable that such a metallizing procedure be inexpensive, easily adapted to mass production and most important not alter the nature of the bulk superconductor material. This is particularly important for certain inorganic oxides including superconducting oxides which might be highly oxidizing and not ordinarily stable in aqueous solutions.

SUMMARY OF THE INVENTION

The invention is a process for electroplating metals and alloys onto inorganic materials to form a metallic-inorganic interface in which the conditions of electroplating minimize chemical reduction of the inorganic material or reaction of the inorganic material with substances such as water. In particular, the electrodeposition is carried out either in nonaqueous media or in aqueous media with applied potential such as to prevent chemical change in the inorganic material. Although a large variety of inorganic materials may be used, it is particularly applicable to inorganic materials that are chemically unstable when exposed to water (e.g., highly oxidizing inorganic mateials) and more particularly to various superconducting oxides typically containing copper ions with average valence greater than 2. Various nonaqueous solvents may be used in the electroplating process including for example acetonitrile, propylene carbonate, methanol and other nonaqueous solvents well known in the electrochemistry art (see, for example, the book entitled "Electrochemical Reactions in Nonaqueous Systems" by Charles K. Mann and Karen K. Barnes, Marcel Dekker, Inc., New York, 1970 and an article entitled "Electrodeposition from Organic Solutions of Metals That Are Difficult to Deposit from Aqueous Solutions" by S. Jayakrishnan et al, Surface Technology, 13 (1981) 225–240 which book and article are incorporated herein by reference). The nonaqueous solvent should be aprotic or at least only be weakly acidic, (preferably more weakly acidic than methanol) with properties such as to permit solution of substances necessary for electroplating. A large variety of metals and alloys are of interest particularly those metals that can be plated in nonaqueous electrolytes including copper, tin, lead, silver, zinc, cadmium, indium and nickel. Typically, the electrolyte comprises a suitable nonaqueous solvent, stable salt of the metal being plated and optionally inert salt to increase conductivity.

Also useful is a plating technique in aqueous media in which a potential is applied to the inorganic material; that potential such that it results in electrodeposition of metal or alloy and results in stabilizing of the inorganic material particularly toward reaction with water. Typically, potentials should be greater (more positive) than that required to electroplate silver from an aqueous solution. Silver is conveniently electroplated with this procedure.

Also included in the invention are articles comprising metal-inorganic interfaces made by the electroplating process described herein. Of particular interest are metal-inorganic interfaces in which the inorganic material is superconducting at some temperature. The unique feature of these structures are the close contact between the superconductor material and electroplated metal and the continuous nature of the plated metallic film. These unique features result in good protection of the superconducting substance fromm the atmosphere (including water in the atmosphere and various pollutants such as $SO_2$ in the atmosphere) and excellent electrical and thermal contact between superconducting material and plated metal.

It should be recognized that the term superconducting oxide is used to refer to a substance that becomes superconducting at some low temperature. Processing such as electroplating is carried out above the transition temperature typically at or near room temperature.

DETAILED DESCRIPTION

Figure 1:
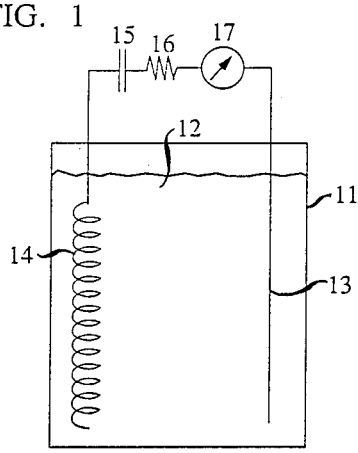
FIG. 1 shows a diagram of a typical plating apparatus.

The invention is based on the discovery that certain superconducting oxide materials can be conveniently electroplated without significant alteration of the superconducting oxide material in a nonaqueous electrolyte or aqueous electrolyte with suitable applied potential. Also, this electroplating process produces articles with unique and useful properties. For example, such articles might include coating superconducting material with metallic or alloy layers to provide electrodes, protective layers, or to provide a parallel conductive path for electrical current in the superconducting body.

Substrate Material

The electroplating process described herein was developed for a certain class of materials, namely superconducting oxide materials which exhibit certain unique chemical properties such as tendency to oxidize other materials are themselves (are themselves easily reduced). However, the electroplating procedure can be used on a very large variety of conductive materials, including examples of inorganic compounds, organic compounds, oxides, nitrides, ceramics, metals, single crystals, polycrystalline substances, etc. For convenience, descriptive words such as inorganic materials, ceramic materials are used but the invention is useful for a large variety of materials.

The invention is particularly significant where the substrate material is highly reactive and difficult to plate because the substrate material reacts under conditions of plating. Such reaction might be detrimental for various reasons The surface of the substrate material might react (e.g., form an oxide) under ordinary conditions of plating making it difficult to electroplate. This is the case with many metals or alloys that form an oxide coating in air or water and are not easily electroplated. In other situations, the substrate material might be altered so that some desirable property is degraded or destroyed. This is the case with various superconducting oxides and these substrate materials form a preferred aspect of the invention.

More specifically, the inventive process applies to various inorganic oxides containing copper with average valence greater than 2, including the various superconducting oxides recently discovered.

The superconducting oxides include the Ba-cuprate system and the La-cuprate system. The Ba-cuprate system is the class of nominal general formula $(M_{1-x}M'_x)_{1+y}Ba_{2-y}Cu_3O_{9-\delta}$, where M and M' are chosen from Y, Eu, Nd, Sm, Gd, Dy, Ho, Er, Tm, Yb, Lu, La, Sc, Sr or combinations thereof, with typically $0 \leq x \leq 1$, $0 \leq y \leq 1$, and $1 < \delta < 3$. For y=0, the material is frequently referred to as a "1-2-3-type" material. In 1-2-3-type materials, the optimal oxygen content frequently corresponds to $\delta \sim 2$. Reference to a compound such as $YBa_2Cu_3O_7$ is intended to include compositions in which $\delta$ is not exactly equal to 2, e.g., $\delta = 2.1$. For examples see, for instance, D. W. Murphy et al, *Physical Review Letters*, Vol. 58 (18), pp. 1888-1890 (1987), incorporated herein by reference.

The La-cuprate system herein is the class of oxides of nominal general formula $La_{2-x}M_xCuO_{4-\epsilon}$, where M is one or more divalent metals (e.g., Ba, Sr, Ca), and $x \geq 0.05$, and $0 \leq \epsilon \leq 0.5$. Both Ba-cuprates and La-cuprates are generally considered to be ceramic materials.

Electrolyte Solvent

The electrolyte bath is made up of electrolyte solvent and one or more salts including source of metal or metals to be electroplated. Often salts are also present to improve conductivity.

An important aspect of the invention is the nature of the solvent used in the electrodeposition bath. The solvent should be aprotic or at least very weakly acidic. Typically, the solvent should be less acidic than methanol. In addition, the solvent should be such as to dissolve reasonable amounts of metal salts (sources of the metal being plated) and other salts to increase electrolyte conductivity. In addition, the solvent should be stable not only to the substrate material being electroplated but under the condition of electroplating the metal.

A large variety of solvents may be used in the practice of the invention. Many of these solvents are well known in the electrochemistry art and are found in various references including the book by C. K. Mann and K. K. Barnes and article by S. Jayakrishnan et al cited above. Many solvents are also known from the literature on nonaqueous batteries.

Typically, the nonaqueous solvent is chosen from various stable organic liquids such as nitriles, carbonates, amides, ketones, alcohols, glycols, ethers, etc. Typical solvents are acetonitrile, benzonitrile, diglyme (diethylene glycol dimethyl ether), triglyme (triethylene glycol dimethyl ether), tetraglyme (tetraethylene glycol dimethyl ether), ethylene glycol, dimethyl formamide, acetamide, acetone, methyl isobutyl ketone, tetrahydrofuran, dimethylsulfoxide, propylene and ethylene carbonates. Particularly useful are acetonitrile, propylene carbonate and methanol. Mixtures of the above solvents may be used as well as other substances that are stable, suitable for use in an electroplating process and not reactive to the material being electroplated. More acidic solvents may be used (even water) provided that the potential required to plate the metal protects the material being electroplated from reaction with water. Particular attention is paid to the characteristics of the electrolyte solvent.

Electroplated Metals and Bath Composition

A large variety of metals and alloys may be plated using the inventive procedure. Particularly interesting are copper, tin, silver, lead, zinc, cadmium, indium and nickel and combinations of these metals. Preferred are the metals copper, silver, tin, lead and tin-lead alloys because of ease of plating, availability, high electrical and thermal conductivity and solderability.

Throughout this application the word metal should be understood to include various alloys (e.g., tin-lead alloy) and mixtures of metals as well as pure elemental metal.

The metals are introduced into the electroplating bath usually in the form of a salt, preferably a salt soluble in the electrolyte solvent and with an anion which is stable under conditions of the electroplating process. Typical anions are nitrate, perchlorate, halide (especially chloride, bromide and iodide), tetrafluoroborate, hexafluoroarsenate. Typically, perchlorates and nitrates are used because of availability and solubility in nonaqueous solvents. Most preferred are perchlorates.

Generally, concentrations vary from about 0.001 Molar to saturation. Too low a concentration requires too much time to electroplate and too many replenishments during processing. Typically, concentrations are adjusted to maximize conductivity when combined with certain ionic (conducting) salts.

The bath is typically made up of nonaqueous solvent described above, an electrochemically stable metal salt of the metal being plated (e.g., nitrate, perchlorate) and optionally a stable salt to increase ionic conductivity. A wide concentration range may be used including from trace amounts (0.001 Molar) to saturation. Preferred concentrations are usually close to saturation, for example from about 1/10 the concentration of a saturated solution to the concentration of a saturated solution. Most preferred are concentrations from 0.1 of saturated solutions to the concentration of the saturated solution.

In addition to nonaqueous solvent described above and metal salt described above, the bath typically contains conducting salts to increase the conductivity of the bath. These conducting salts are typically alkali-metal salts with stable anions with good solubility in the nonaqueous solvents. Typical anions are the same as for the metal salts given above (nitrate, perchlorate, halides, tetrafluoroborate (e.g. sodium tetrafluoroborate) and hexafluoroaresenate (e.g., lithium hexafluroarsenate). Also useful are the tetra alkylammonium salts such as tetrabutylammonium halides and tetraethyl ammonium halides. Typically, the bath should have a conductivity greater than $10^{-3}$ mho-cm.

Concentrations of the conducting salts may vary from 0.001 molar to saturation and are usually determined so as to maximize conductivity of the bath. Generally, concentrations near saturation (within 0.1 of saturation to saturation) are preferred.

The electroplating process is carried out in the conventional manner with conventional anode and the material to be plated made the cathode of the electroplating apparatus.

In addition to electroplating from a nonaqueous bath, one can electroplate silver onto superconducting oxide from aqueous solutions with excellent results. Typical concentrations of silver are from 0.001M to saturation and conducting salts are conveniently used to increase conductivity of the solution. Various sources of silver well known in the art may be used (silver nitrate is particularly convenient) and various conducting salts well known in the art may be used (e.g., alkali metal nitrates such as sodium nitrate). The concentration of conducting salts are typically from 1/10 the concentration of a saturated solution to the concentration of a saturation solution is usually determined so as to maximize conductivity. It is believed that silver can be successfully electroplated in aqueous baths onto superconductive oxides because the electroplating potential is sufficiently positive to stabilize the superconductive oxide. Other metals or alloys may also fall in this category, that is, be electroplated out of an aqueous bath at a sufficiently positive potential so as to stabilize the superconducting oxide or other material with a tendency to reduce in water.

The invention is particularly well illustrated by a number of examples:

EXAMPLE 1

Silver is electroplated on a substrate comprising $YBa_2Cu_3O_7$ using a concentration of 0.001M $AgNO_3$ in an electrolyte made up of 1.0M Li $ClO_4$ in methanol. Excellent silver plating is obtained with good adhesion to the substrate.

EXAMPLE 2

Same as above but a concentration of 0.01M $AgNO_3$.

EXAMPLE 3

Same as the two examples above but $AgClO_4$ is used as the source of silver.

EXAMPLE 4

Silver is also plated on the superconducting oxide using 1.0M $LiClO_4$ in acetonitrile as the electrolyte. Both $AgClO_4$ and $AgNO_3$ with concentrations of 0.001M and 0.01M are useful as the source of silver. Excellent platings are obtained.

EXAMPLE 5

Silver is also plated using 1.0M $LiClO_4$ in propylene carbonate as the electrolyte. With $AgClO_4$ in a concentration of 0.004M, excellent plating is obtained.

EXAMPLE 6

Copper is also plated using 1.0M $LiClO_4$ in methanol as the electrolyte. At concentrations of 0.005M and 0.010M using copper nitrate and copper perchlorate, excellent results are obtained.

EXAMPLE 7

Same as Example 6 except 1.0M $LiClO_4$ in acetonitrile and concentrations of 0.005M and 0.1M are used. Excellent results are obtained.

EXAMPLE 8

Lead is electroplated onto a substrate comprising superconducting oxide using the following three electrolytes 1.0M $LiClO_4$ in methanol, 1.0M $LiClO_4$ in acetonitrile and 1.0M $LiClO_4$ in propylene carbonate. With lead perchlorate as the source of lead and concentrations of 0.005M, 0.01M and 1.0M, excellent adherent platings are obtained.

EXAMPLE 9

Tin is also plated on superconducting oxide with excellent results. A 1.0M $LiClO_4$ acetonitrile solution is used as electrolyte and tin chloride with concentration of 0.012M as the source of tin.

EXAMPLE 10

Silver is also electroplated from an aqueous electrolyte containing sodium nitrate as the conducting salt and $AgNO_3$ with concentrations of 0.001M and 1.0M as the source of silver. Excellent platings are obtained.

FIG. 1 shows a typical apparatus 10 for carrying out the electrodeposition process. The apparatus 10 comprises a container 11 for holding the electroplating bath 12, an anode 13, article to be plated 14 and a source of electrical current 15. A resistor 16 and meter 17 are used to control and measure current.

An important aspect of the electroplating process described above is that the process is carried out on the already formed superconducting oxide without altering the characteristics, properties or composition of the bulk superconducting oxide. For example, the electroplating process may be carried out on a superconducting oxide formed by the process described in a recently filed application entitled "Methods of Making a Body, and Article Comprising the Body" with inventors Ho Sou Chen, George Sanford Indig and Lionel Cooper Kimerling filed on or about Jan. 11, 1988, Ser. No. 142,752. This application is incorporated herein by reference. The process described in this reference may be used to form a large variety of bodies comprising chemical compounds such as metal oxides and nitrides but is primary directed toward forming superconducting oxides. A general description of this procedure for forming superconducting oxides is as follows:

The method comprises forming a precursor melt and contacting at least a part of the melt with oxygen such that the concentration of oxygen in the part of the melt increases to a critical concentration, resulting in formation of the desired oxide, substantially without drop in temperature. The precursor melt comprises at least one metallic element M, and at least the part of the melt is at temperature T, with $T_m < T < T_o$, where $T_m$ is the freezing temperature of the melt and $T_o$ is the melting temperature of the superconductive oxide. In an exemplary embodiment the melt consists essentially of Yb, Ba and Cu in 1:2:3 atomic ratio, T is about 900° C.) substrate into the melt, exposing the melt-coated substrate to oxygen such that oxygenation and solidification of the coating results, and furnace cooling the coated substrate in oxygen. The thus produced coating has composition $YbBa_2Cu_3O_{9-\delta}$ ($\delta \sim 2.1$), is essentially single phase, strongly textured, has $T_c$ of about 85 K. and $J_c$ of about $3 \times 10^4$ A/cm$^2$. An aspect of the invention is the fact that the precursor melt need not be stoichiometric. For instance, we have formed a layer of composition $YbBa_2Cu_3O_7$ from a melt of composition $Yb_2BaCu$. The ability to practice the inventive method with non-stoichiometric precursor melts makes it possible to produce Y-containing bodies (e.g., $YBa_2Cu_3O_7$ films on a copper substrate). The inventive technique can produce compositionally essentially homogeneous material. It is readily adaptable to produce ceramics (including high $T_c$ superconductors) and other materials (e.g., AlN) in a variety of shapes (including wire tape, powders) by a variety of techniques (including continuous processing). The method can also be used to form a superconductive bond between two pre-existing ceramic superconductive bodies.

After forming the superconducting body, the electroplating procedure described above is used to form a metallic layer on at least a portion of the exposed superconducting oxide so as to form a metallic layer in good electrical and thermal contact with the oxide. This metallic layer may serve as a metallic electrode, as a protective barrier for the superconducting oxide or as a parallel conductive path in a superconductive device.

For example, superconducting wire or ribbon may be produced (e.g. for a superconducting magnet) using a metallic substrate (e.g., copper) using the process described in the application cited above. After forming the wire or ribbon coated with the superconducting oxide, the wire or ribbon is electroplated in accordance with the process outlined above. The resulting wire or ribbon is coated with electroplated metal for both protection from atmospheric constituents (e.g., water) and has a parallel conductive path to protect the superconductive oxide against sudden surges of current which might result when the superconductor suddenly turns normal.

A number of articles can be made in accordance with the invention. Generally, such articles comprise a metal-superconducting oxide interface made in accordance with the invention. Unique for these articles is the excellent thermal and electrical contact between metal and superconduction oxide which is highly advantageous both to remove current and heat when the superconducting oxide suddenly turns normal. Many superconducting structures are useful in a variety of articles. Some such structures are in the figures described below.

Figure 2:
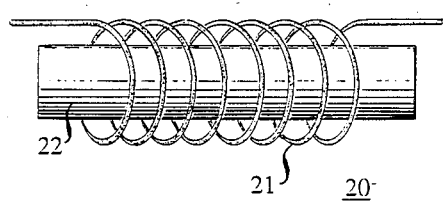
FIG. 2 shows a superconducting device including a superconducting coil made in accordance with the invention.

FIG. 2 shows a device 20 with coil of wire 21 made in accordance with the invention. Such superconducting coils are useful for storing energy, for solonoids, motor windings, etc. The core 22 may be magnetic or non-magnetic material.

Figure 3:
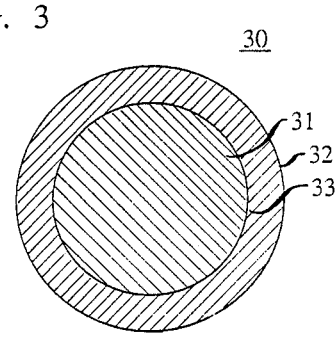
FIG. 3 shows an end view of a superconducting wire made in accordance with the invention.

FIG. 3 shows an end view 30 of a superconducting wire made in accordance with the invention. The wire comprises center core of superconducting material 31 and protective metal cladding 32 made in accordance with the invention. Of particular importance is the metal-superconductor interface 33 where good electrical and thermal contact is highly desirable.

Figure 4:
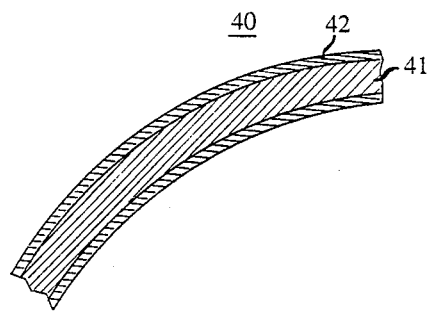
FIG. 4 shows a side view of a ribbon or wire made in accordance with the invention.

FIG. 4 shows a side view of a wire or ribbon type structure 40 with superconducting center 41 and metal cladding 42 electroplated onto the superconductor in accordance with the invention.

Figure 5:
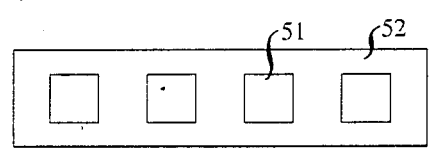
FIG. 5 shows a structure with patterned metal contacts on a superconducting substrate made in accordance with the invention.

FIG. 5 shows a structure 50 comprising patterned metal contacts 51 on a superconducting substrate 50. The metal contacts are put down by electrodeposition in accordance with the invention. Typically, a photoresist procedure is used to pattern the electroplated metal on the superconductor substrate.

Typical articles are power transmission lines, rotating machinery (motors, etc.) and superconducting magnets for, e.g., fusion generators, MHD generators, particle accelerators, levitating vehicles, magnetic separation, and energy storage as well as junction devices and detectors.

We claim:

1. A process for making an article comprising a metal-material interface comprising the step of electroplating said metal onto the material from an electroplating bath with conductivity greater than $10^{-3}$ mho-cm, said electroplating bath comprising nonaqueous solvent and source of metal to be electroplated, said metal capable of electrodeposition from a nonaqueous electroplating bath characterized in that the material is a superconducting oxide with superconducting transition temperature greater than 77 degrees Kelvin.

2. The process of claim 1 in which the superconducting oxide comprises copper ion with an average valence greater than 2.

3. The process of claim 2 in which the superconducting oxide is a Ba-cuprate with nominal composition $YBa_2Cu_3O_7$.

4. The process of claim 2 in which the superconducting oxide is a La-cuprate with nominal composition $La_{1.8}Sr_{0.2}CuO_4$.

5. The process of claim 1 in which the metal is selected from the group consisting of silver, copper, tin, lead, zinc, cadmium, indium and nickel and alloys of these metals.

6. The process of claim 5 in which the metals are selected from the group consisting of silver, copper, tin and lead.

7. The process of claim 6 in which the metal is copper.

8. The process of claim 1 in which the nonaqueous solvent comprises a substance selected from the group consisting of nitriles, carbonates, amides, ketones, alcohols, glycols and ethers and mixtures of these substances.

9. The process of claim 1 in which the nonaqueous solvent comprises a substance selected from the group consisting of acetonitrile, benzonitrile, diglyme (diethylene glycol dimethyl ether), triglyme (triethylene glycol dimethyl ether), tetraglyme (tetraethylene glycol dimethyl ether), ethylene glycol, dimethyl formamide, acetamide, methanol, acetone, methyl isobutyl-ketone, tetrahydrofuran, dimethyl sulfoxide, propylene carbonate and ethylene carbonate.

10. The process of claim 9 in which the substance is selected from the group consisting of propylene carbonate, methanol and acetonitrile.

11. The process of claim 1 in which the electroplating bath comprises, in addition to nonaqueous solvent and source of metal, conducting salt to increase the conductivity of the electroplating bath.

12. The process of claim 11 in which the conducting salts comprise a conducting substance selected from the group consisting of alkali-metal nitrates, perchlorates, tetrafluoroborates, hexafluoroarsenates and halides.

13. The process of claim 12 in which the conducting salt comprises lithium perchlorate.

14. The process of claim 11 in which the conducting salt comprises tetraalkyl ammonium salt.

15. A process for making an article comprising a silver-material interface comprising the step of electroplating silver onto the material from an aqueous electroplating bath with conductivity greater than $10^{-3}$ mho-cm, said aqueous electroplating bath comprising water and a source of silver characterized in that the material is a superconducting oxide with superconducting transition temperature greater than 77 degrees Kelvin.

16. The process of claim 1 in which the superconducting oxide comprises copper ion with average valance greater than 2.

17. The process of claim 16 in which the superconducting oxide is a Ba-cuprate with nominal composition $YBa_2Cu_3O_7$.

18. The process of claim 16 in which the superconducting oxide is a La-cuprate with nominal composition $La_{1.8}Sr_{0.2}CuO_4$.

19. The process of claim 15 in which the aqueous electroplating bath comprises, in addition to source of silver, a conducting salt to increase the conductivity of the electroplating bath.

20. The process of claim 1 or 15 in which prior to electroplating the superconducting oxide, the superconducting oxide material with composition $M_xM'_y...O_z$ with M, M' ... being metallic elements, wherein the superconductive oxide material is produced by a method that comprises (a) forming a melt that comprises M, M' ... ;
(b) causing solidification of at least a part of the melt, the quantity of the superconductive oxide material being, or being derived from, the solidified part of the melt, and
(c) completing making the article;
characterized in that (d) the melt is an elemental melt comprising at least one of M, M' ... in elemental form;
(e) at least the part of the melt is at a temperature T, with $T_m < T < T_o$, where $T_m$ is the freezing temperature of the melt and $T_o$ is a melting temperature associated with the superconductive oxide material;
(f) step (b) comprises contacting at least the part of the melt with an oxygen-containing atmosphere such that the concentration of oxygen in the part of the melt, solid material of composition $M_xM'_y...O_z$, (z(fm may be, but need not be, different from z) is formed.

21. Articles made by the process of claim 20.

22. An article comprising metal-material interface characterized in that the material is a superconducting oxide with superconducting transition temperature greater than 77 degrees Kelvin and the metal-material interface is made by electroplating metal onto the material from an electroplating bath comprising nonaqueous solvent and source of metal.

23. The article of claim 22 in which the metal-material interface is in the form of a wire or cylinder with metal covering at least a portion of the surface of the superconducting oxide.

24. The article of claim 22 in which the metal-material interface is in the form of a ribbon with the electroplated metal covering at least a portion of the superconducting oxide.

25. The article of claim 23 or 24 in which the wire or ribbon is in the form of a coil.

26. The article of claim 25 in which the coil is part of a motor.

27. The article of claim 25 in which the coil is part of a solenoid or magnet.

28. The article of claim 25 in which the coil is part of an energy storage device.

29. The article of claim 22 in which the article comprises metal patterned on a superconducting substrate.

30. An article comprising silver-material interface characterized in that the material is a superconducting oxide with superconducting transition temperature greater than 77 degrees Kelvin and the silver-material interface is made by electroplating silver onto the material from an aqueous electroplating bath comprising source of silver and water and using a potential sufficient to electroplate silver.

31. The article of claim 30 in which the silver-material interface is in the form of a wire with silver covering at least a portion of the surface of the superconducting oxide.

32. The article of claim 30 in which the metal-material interface is in the form of a ribbon with the electroplated metal covering at least a portion of the superconducting oxide.

33. The article of claim 3 or 32 in which the wire or ribbon is in the form of a coil.

34. The article of claim 33 in which the coil is part of a motor.

35. The article of claim 33 in which the coil is part of a solenoid.

36. The article of claim 33 in which the coil is part of an energy storage device.

37. The article of claim 30 in which the article comprises metal patterned on a superconducting substrate.

38. The article of claim 22 or 30 in which the article is part of a power transmission line.

39. The article of claim 22 or 30 in which the article comprises a metal-superconducting junction.

* * * * *